(12) United States Patent
Kimbara et al.

(10) Patent No.: US 6,396,143 B1
(45) Date of Patent: *May 28, 2002

(54) BALL GRID ARRAY TYPE PRINTED WIRING BOARD HAVING EXELLENT HEAT DIFFUSIBILITY AND PRINTED WIRING BOARD

(75) Inventors: Hidenori Kimbara; Nobuyuki Ikeguchi; Katsuji Komatsu, all of Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/557,974

(22) Filed: Apr. 25, 2000

(30) Foreign Application Priority Data

Apr. 30, 1999 (JP) .............................. 11-125051
Apr. 30, 1999 (JP) .............................. 11-125055
Jun. 21, 1999 (JP) .............................. 11-174549

(51) Int. Cl.⁷ .............................................. H01L 23/34
(52) U.S. Cl. ........................ 257/712; 257/713; 257/738; 257/773; 257/779; 257/784
(58) Field of Search ................................. 257/738, 773, 257/774, 779, 784, 701, 702, 706, 707, 668, 712, 676, 713

(56) References Cited

U.S. PATENT DOCUMENTS 6,097,089 A * 8/2000 Gaku et al. .................. 257/712
6,255,742 B1 * 7/2001 Inaba ......................... 257/796

FOREIGN PATENT DOCUMENTS

JP 10321769 A * 12/1998

* cited by examiner

Primary Examiner—Nathan Flynn
Assistant Examiner—Remmon R. Fordé
(74) Attorney, Agent, or Firm—Wenderoth, Lind & Ponack, LLP

(57) ABSTRACT

A printed wiring board for a ball grid array type semiconductor plastic package which has excellent heat diffusibility and causes no popcorn phenomenon, and a metal-plate-inserted printed wiring board having wire bonding pads formed at two levels, for use in the ball grid array type semiconductor plastic package.

3 Claims, 8 Drawing Sheets

Fig.1
(1) 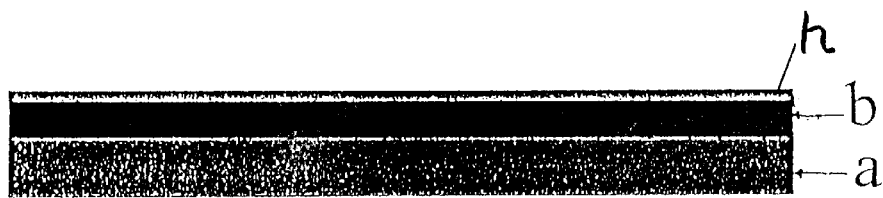
(2) 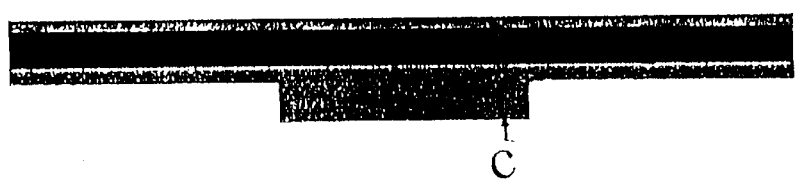
(3-1) 
(3-2) 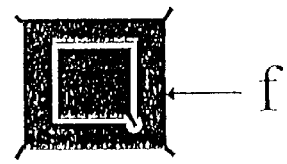
(4) 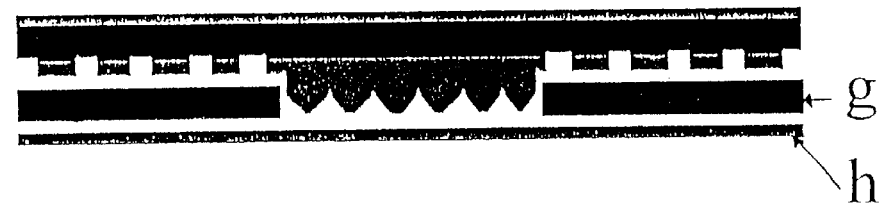
(5) 

BALL GRID ARRAY TYPE PRINTED WIRING BOARD HAVING EXELLENT HEAT DIFFUSIBILITY AND PRINTED WIRING BOARD

FIELD OF INVENTION

The present invention relates to a method of producing a method of producing a printed wiring board for a novel ball grid array type semiconductor plastic package in which at least one semiconductor chip is mounted in a printed wiring board, and also relates to a printed wiring board. The printed wiring board produced according to the present invention is suitable for use in a relatively high-power, multi-terminal and high-density semiconductor plastic package such as a microprocessor, a micro-controller, an application specific IC (ASIC), a graphic terminal, or the like. The semiconductor plastic package is mounted on a mother board printed wiring board with solder balls, and the mother board is used for an electronic machine or equipment.

DESCRIPTION OF PRIOR ART

As a semiconductor plastic package, a plastic ball grid array (P-BGA), a plastic land grid array (P-LGA), etc., are known. Such a semiconductor plastic package has a structure in which a semiconductor chip is fixed on an upper surface of a plastic printed wiring board, the chip is connected to a conductor circuit formed on the upper surface of the printed wiring board by wire bonding, conductor pads are formed on the lower surface of the printed wiring board, the conductor pads are formed of solder balls for connecting the semiconductor plastic package to a mother board printed wiring board, the conductor circuit on the front and reverse surfaces are connected through plated through hole(s), and the semiconductor chip is encapsulated with a resin. For diffusing heat generated in the semiconductor into the mother board printed wiring board, the above structure is also provided with plated heat-diffusing through hole(s) which lead or leads from a metal foil which is on the upper surface and on which the semiconductor chip is mounted to the reverse surface.

Moisture is absorbed into a silver-powder-containing resin adhesive used for fixing the semiconductor chip, and the moisture may cause a inter-layer swelling under heat through the through hole(s) when the solder balls are heated for mounting the plastic package on the mother board or removing it from the mother board. The above swelling is called a popcorn phenomenon. When the popcorn phenomenon takes place, the package is no longer usable in many cases, and it is required to prevent the occurrence of the pop-corn phenomenon drastically.

Further, higher function and higher density of a semiconductor mean an increase in heat generated, and the forming of only through holes immediately below a semiconductor chip comes to be insufficient for heat diffusion.

SUMMARY OF THE INVENTION

It is an object of the present invention to provide a method of producing a printed wiring board for a ball grid array type semiconductor plastic package which has excellent heat diffusibility and causes no popcorn phenomenon, and a printed wiring board.

According to the present invention 1, there is provided a method of producing a printed wiring board for use in a ball grid array type semiconductor plastic package, the printed wiring board having a structure in which a metal plate is placed in a region located as part of the thickness direction of a printed wiring board, the metal plate has a flat region in one surface, a plurality of metal protrusions having the form of frustum of a cone each are formed in the other surface of the metal plate so as to be connected to a copper foil forming a reverse surface, the metal plate has a size nearly equivalent to the size of the printed wiring board, a semiconductor is fixed on the flat region located at a level lower than the level of a circuit and a circumferential bonding pad on the front surface of the printed wiring board, the metal plate and a signal propagation circuit conductor on the front surface of the printed wiring board are insulated from each other with a thermosetting resin composition, the said circuit conductor and the semiconductor chip are connected by wire bonding, and at least the signal propagation circuit conductor on the front surface of the printed wiring board and a circuit conductor formed on an opposite surface of the printed wiring board or circuit conductor pads formed on the opposite surface of the printed wiring board for connecting the package to another circuit with solder balls are connected with through hole conductor, the method comprising the steps of a. etching the metal plate of a metal-clad laminate board formed of the metal plate, a glass fabric base material/thermosetting resin composition prepreg sheet and a copper foil which are laminated in this order, to form an elevated portion in that region of the metal plate which is opposed to the flat region where the semiconductor is to be mounted, b. forming protrusions having the form of frustum of a cone each in the elevated portion and forming a circuit around the elevated portion, c. placing a glass fabric base prepreg sheet on a region including said circuit but excluding an area of the protrusions, the prepreg sheet having a hole which is made so as to correspond to a region of the metal protrusions and has a size little larger than the region of the metal protrusions, placing a copper foil on the prepreg sheet and the area of the hole, and forming the resultant set into a laminate under heat and pressure to form a double-side copper-clad laminate, d. making penetration holes for through holes in a region other than the area of the metal protrusions having the form of frustum of a cone each, plating the penetration holes with copper, and removing copper foil, glass fabric base and resin layer on at least the flat region where the semiconductor chip is to be mounted, to expose a metal surface, e. forming a bonding pad and a circuit for signal propagation on a region around the flat region where the semiconductor chip is to be mounted, forming, on the opposite surface, solder ball pads for connecting the metal foil with which the metal protrusions having the form of frustum of a cone each are in contact, to solder balls for heat diffusion and forming a circuit on the opposite surface, and f. plating at least a semiconductor-chip-mounting portion, a wire bonding pad portion and a solder ball pad portion with a noble metal.

According to the present invention 2, there is provided a method of producing a printed wiring board according to the above, wherein a circuit including a bonding pad which is to be connected to the semiconductor chip by wire bonding is formed on two levels, the method comprising the steps of a. forming a circuit in a region of one surface of a glass fabric base material/double side metal-clad laminate which region is other than a semiconductor-chip-mounting portion but is on a front surface of the laminate, and forming a plurality of metal protrusions having the form of frustum of a cone each and a circuit on the other surface of the laminate which surface is the reverse surface, b. placing a glass fabric base material/thermosetting resin composition prepreg sheet on the front surface, placing a metal foil thereon, placing a glass fabric base prepreg sheet on the reverse surface, the glass fabric base prepreg sheet having a hole which is made so as to correspond to a region of the metal protrusions and has a size a little larger than the region of the metal protrusions, placing a metal foil thereon, and forming the resultant set into a laminate under heat and pressure to obtain a double-side metal-clad multi-layered board, c. making penetration holes for through holes in a portion which is present neither in the semiconductor-chip-mounting portion nor in the region of the productions having the form of frustum of corn each, plating the penetration holes with a metal, removing at least metal foil, glass fabric base and resin layer on the semiconductor-chip-mounting portion on the front surface, to expose a bonding pad of a second level, and then exposing a metal surface which is to constitute the semiconductor-chip-mounting portion, and d. forming at least a bonding pad of a first level and a circuit on the front side, forming, on the reverse surface, solder ball pads for connecting heat-diffusing solder balls to a surface metal foil to which the metal protrusions having the form of frustum of a cone each are in contact, forming a circuit on the reverse surface, and plating at least the semiconductor-chip-mounting portion, a wire bonding pad portion and a solder ball pad portion with a noble metal.

According to the present invention 2, there is also provided a method of producing a printed wiring board according to the above, wherein the metal foil forming a surface layer of the multi-layered board is removed, the thermosetting resin composition and the glass fabric base layer are cut off by a sand blasting method until the bonding pad of the second level is reached, the bonding pad of the second level is coated, and then, the resin layer and the glass fabric base layer are cut off by a sand blasting method until the metal plate is reached, whereby the bonding pad portion of the second level and the semiconductor-chip-mounting portion are exposed.

According to the present invention 3, further, there is provided a metal-plate-inserted printed wiring board having wire bonding pads formed at two levels, for use in a ball grid array type semiconductor plastic package, the printed wiring board having a structure in which the metal plate is placed in a region located as part of the thickness direction of a printed wiring board, the metal plate has a flat region in one surface, a plurality of metal protrusions having the form of frustum of a cone each are formed in the other surface of the metal plate so as to be connected to a copper foil forming a reverse surface, the metal plate has a size nearly equivalent to the size of the printed wiring board, a semiconductor is fixed on the flat region located at a level lower than the level of a signal propagation circuit and circumferential bonding pads of two levels on one surface of the printed wiring board, the metal plate and a signal propagation circuit conductor on the front surface of the printed wiring board are insulated from each other with a thermosetting resin composition, the signal propagation circuit conductor and the semiconductor chip are connected through the bonding pads of two levels by wire bonding, and at least the signal propagation circuit conductor on the front surface of the printed wiring board and a circuit conductor formed on an opposite surface of the printed wiring board or circuit conductor pads formed on the opposite surface of the printed wiring board for connecting the package to an outside with solder balls are connected with a through hole conductor insulated from the metal plate with a resin composition, the printed wiring board being produced by providing a metal plate, one surface of the metal plate having a flat region where the semiconductor is to be mounted, the other surface of the metal plate having a plurality of metal protrusions having the form of frustum of a cone each, the metal plate having a clearance hole or a slit in a region which is neither a semiconductor-chip-mounting portion nor a region of the metal protrusions having the form of frustum of a cone each, placing a glass fabric base material/thermosetting resin prepreg on one surface of the metal plate, placing a glass fabric base material/thermosetting resin prepreg on the other surface of the metal plate, placing a double-side copper-clad laminate having a bonding pad of the second level and an inner layer circuit on the prepreg on one surface such that the circuit faces inward, placing a glass fabric prepreg sheet on the prepreg on the other surface, the glass fabric prepreg sheet having a hole made so as to correspond to the region of the metal protrusions and so as to have an area a little larger than the region of the metal protrusions, placing a copper foil on the glass fabric prepreg, forming the resultant set into a laminate under heat and pressure to obtain a double-side copper-clad multi-layered board, making a through hole nearly in the center of the clearance hole or the slit so as not be in contact with the metal plate, plating the through hole with copper, removing copper foil, glass fabric base and resin layer on a semiconductor-chip-mounting portion and a bonding pad portion of the second level on a front surface, to expose the bonding pad of the second level, exposing part of the metal plate for the semiconductor-chip-mounting portion,, forming the bonding pad of the first level and a circuit on the front surface, forming solder ball pads for connecting the protrusions of the metal plate to heat-diffusing solder balls and a circuit in a copper foil to which the protrusions of the metal plate are in contact, and plating at least the semiconductor-chip-mounting portion side, a wire bonding pad portion and a solder ball portion with a noble metal.

BRIEF DESCRIPTION OF DRAWINGS

FIG. 1 shows steps of producing a printed wiring board for use in a metal-plate-inserted ball grid array type semiconductor plastic package in Example 1.

DETAILED DESCRIPTION OF THE INVENTION

Figure 2:
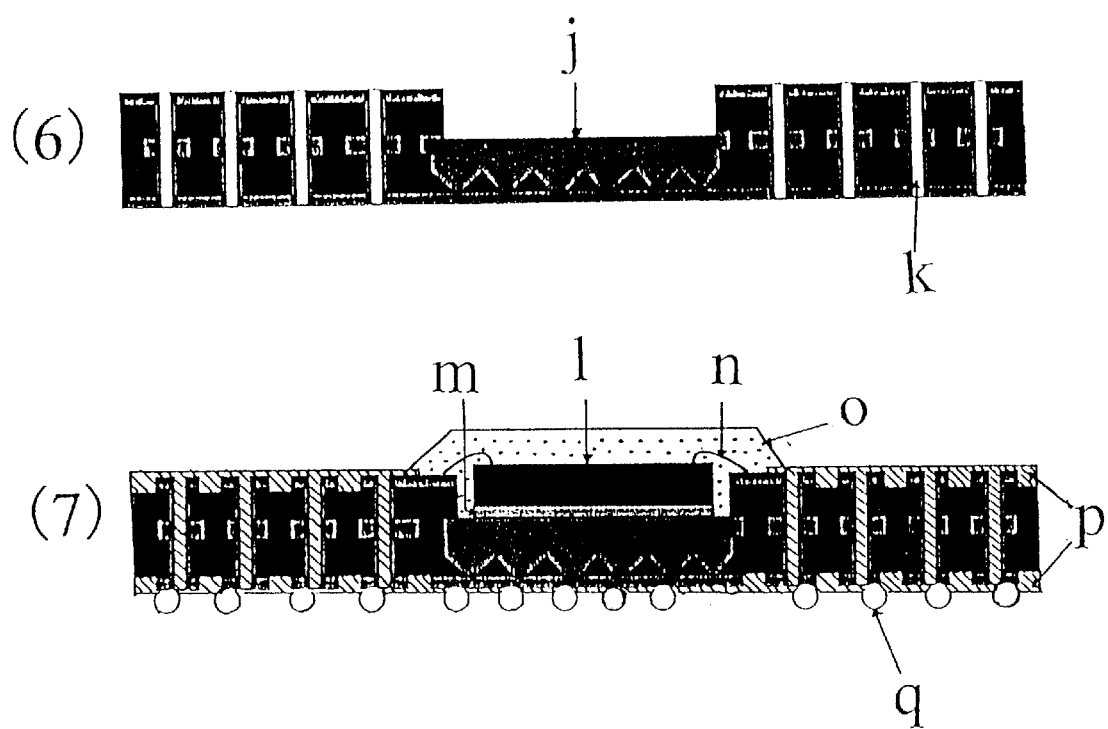
FIG. 2 shows steps of producing a printed wiring board for use in a metal-plate-inserted ball grid array type semiconductor plastic package in Example 1.

In FIGS. 1 to 8, reference symbols have the following meanings, that is, a shows a metal plate, b shows a glass fabric base material/thermosetting resin layer, c shows an elevated portion, d shows metal protrusions having the form of frustum of a cone each, f shows a semiconductor chip (which is isolated from its circumferential circuit), g shows a prepreg sheet having a hole corresponding to the area of the metal protrusions, h shows a copper foil, i shows a double-side copper-clad multilayer laminate, j shows a metal exposed portion (flat portion) where a semiconductor chip is to be mounted, k shows a through hole for connecting circuits on front and reverse surfaces, l shows a semiconductor chip, m shows a heat-conductive adhesive (silver paste), n shows a bonding wire, o shows an encapsulation resin, p shows a plating resist, q shows a solder ball, r shows a heat-diffusing through hole, s shows a prepreg sheet, t shows a copper plate, u shows a second-level bonding pad, v shows a glass fabric base and a resin layer on a metal portion on which a semiconductor chip is to be mounted, w shows a first-level bonding pad, x shows an etching resist, y shows an inner-layer circuit formed in a double-side copper-clad multilayer laminate, z shows a protective sheet made of a metal, α shows metal protrusions having the form of frustum of a cone each, formed outside a package, and β shows a solder ball pad.

A semiconductor plastic package is produced as follows. A semiconductor chip is fixed on a surface of a metal plate which surface constitutes a cavity, with a heat-conductive adhesive such as a silver paste, the semiconductor chip is connected by wiring bonding, then the semiconductor chip and bonding wires are encapsulated with a resin, and solder balls are melt-connected to a reverse surface.

The semiconductor plastic package produced according to the present invention is excellent in heat conductivity, free of absorption of moisture from its lower surface, is greatly improved in heat resistance after moisture absorption, i.e., causes no popcorn phenomenon, and is also suitable for mass production. There is therefore provided semiconductor plastic packages which are improved in economic performances and have a novel structure. Further, the present invention uses a polyfunctional cyanate ester composition as a thermosetting resin, so that there can be provided semiconductor plastic packages which are excellent in electric insulation after a pressure cooker test and anti-migration properties and have a novel structure.

The structure of a ball grid array type semiconductor plastic package using the printed wiring board produced according to the present invention will be explained hereinafter. A metal plate is placed in a region located as part of the thickness direction of a printed wiring board. A region of the metal plate which region is for mounting a semiconductor chip is flat. On the opposite side of the printed wiring board, metal protrusions having the form of frustum of a cone each are connected to a copper foil forming a surface on the opposite side. The metal plate has a size nearly equivalent to the size of printed wiring board. The surface region of the metal plate which surface region is for mounting a semiconductor chip is positioned at a level lower than the level of a circuit conductor including a peripheral bonding pad, and the surface region constitutes a cavity and is an exposed metal surface. At least one semiconductor chip is fixed to the above surface region with a heat-conductive adhesive, and the above circuit conductor and the semiconductor chip are connected to each other by wire bonding through the bonding pad. On the opposite side of the printed wiring board, protrusions which have the form of frustum of a cone each and are formed of part of the metal plate are in contact with, and connected to, a copper foil forming the opposite surface, and a circuit conductor pad formed for connecting a circuit conductor formed so as to be connected to the above metal protrusions or the package to an outside is connected to at least the signal propagation circuit conductor on the front surface with a through hole conductor. And, at least the semiconductor chip, the wire and the bonding pad are encapsulated with a resin.

In the printed wiring board according to the present inventions 2 and 3, the bonding pad is formed at two levels in the thickness direction, and the semiconductor is connected to the bonding pad by wire bonding.

The method of producing the printed wiring board of the present invention 1 comprises the following steps.

a. etching the metal plate of a metal-clad laminate board formed of the metal plate, a glass fabric base material/thermosetting resin composition prepreg sheet and a copper foil which are laminated in this order, to form an elevated portion in that region of the metal plate which is opposed to the flat region where the semiconductor is to be mounted, b. forming protrusions having the form of frustum of a cone each in the elevated portion and forming a circuit around the elevated portion, c. placing a glass fabric base prepreg sheet on a region including said circuit but excluding the elevated portion, the prepreg sheet having a hole which is made so as to correspond to a region of the metal protrusions and has a size little larger than the region of the metal protrusions, placing a copper foil on the prepreg sheet and the area of the hole, and forming the resultant set into a laminate under heat and pressure to form a double-side copper-clad laminate, d. making penetration holes for through holes in a region other than the area of the metal protrusions having the form of frustum of a cone each, plating the penetration holes with copper, and removing copper foil, glass fabric base and resin layer on at least the flat region where the semiconductor chip is to be mounted, preferably with a sand blasting method, to expose a metal surface, e. forming a bonding pad and a circuit for signal propagation on a region around the flat region where the semiconductor chip is to be mounted, forming, on the opposite surface, solder ball pads for connecting the metal foil with which the metal protrusions having the form of frustum of a cone each are in contact, to solder balls for heat diffusion and forming a circuit on the opposite surface, and f. plating at least a semiconductor-chip-mounting portion, a wire bonding pad portion and a solder ball pad portion with a noble metal.

The method of producing a printed wiring board having bonding pads of two levels according to the present invention 2 will be explained below.

The method of producing a printed wiring board according to the present invention 2 comprises a. forming a circuit in a region of one surface of a glass fabric base/double side metal-clad laminate which region is other than a semiconductor-chip-mounting portion but is on a front surface of the laminate, and forming a plurality of metal protrusions having the form of frustum of a cone each and a circuit on the other surface of the laminate which surface is the reverse surface, b. placing a glass fabric base material/thermosetting resin composition prepreg sheet on the front surface, placing a metal foil thereon, placing a glass fabric base prepreg sheet on the reverse surface, the glass fabric base prepreg sheet having a hole which is made so as to correspond to a region of the metal protrusions and has a size a little larger than the region of the metal protrusions, placing a metal foil thereon, and forming the resultant set into a laminate under heat and pressure to obtain a double-side metal-clad multi-layered board, c. making penetration holes for through holes in a portion which is present neither in the semiconductor-chip-mounting portion nor in the region of the productions having the form of frustum of corn each, plating the penetration holes with a metal, removing at least metal foil, glass fabric base and resin layer on the semiconductor-chip-mounting portion on the front surface, to expose a bonding pad of a second level, and then exposing a metal surface which is to constitute the semiconductor-chip-mounting portion, and d. forming at least a bonding pad of a first level and a circuit on the front side, forming, on the reverse surface, solder ball pads for connecting heat-diffusing solder balls to a surface metal foil to which the metal protrusions having the form of frustum of a cone each are in contact, forming a circuit on the reverse surface, and plating at least the semiconductor-chip-mounting portion, a wire bonding pad portion and a solder ball pad portion with a noble metal.

In the present invention 1, the method of forming a cavity portion which constitutes a semiconductor-chip-mounting portion in the double-side copper-clad laminate is not critical. Preferably, the cavity portion is formed by removing copper foil on the semiconductor-chip-mounting portion and then cutting off glass fabric base and thermosetting resin composition by a sand blasting method. When the printed wiring board is produced, the double-side copper-clad laminate may have circuits formed on front and reverse surfaces thereof in advance of the above cutting by a sand blasting method. In this case, the circuits formed on the front and reverse surfaces are coated with a protective resist before the sand blasting is carried out. When the plating with a noble metal is carried out, there may be employed a constitution in which the entire surface is plated with a noble metal and a portion on which the plating is unnecessary is coated with a permanent protective resist.

In a known method in which a semiconductor chip is fixed on an upper surface of a metal-core-inserted printed wiring board having a through hole, it is inevitable to diffuse heat generated by a semiconductor chip through a heat-diffusing through hole formed immediately below the semiconductor memory cell chip like heat-diffusion in a conventional P-BGA package, and a popcorn phenomenon cannot be overcome. The present invention employs a structure in which the through hole is not formed below a region where a semiconductor is mounted, so that no moisture is absorbed through the reverse surface of the semiconductor, so that the possibility of the popcorn phenomenon occurring is remarkably low, and there can be provided a method of producing a semiconductor plastic package having excellent heat diffusibility.

In the present invention 2, the method of forming a cavity portion which constitutes a semiconductor-chip-mounting portion in the double-side copper-clad multi-layered board is not critical. Preferably, the cavity portion is formed by cutting off coopper foil, glass fabric base and thermosetting resin composition on the semiconductor-chip-mounting portion by a sand blasting method. First, metal foil, glass fabric base and thermosetting resin composition on the semiconductor-chip-mounting portion and on a region which is to constitute the bonding pad portion of the second level are cut off by a sand blasting method, to expose the bonding pad of the second level. The bonding pad of the second level is protected with a protective coating or a protective metal so as not to be cut off, as required, and glass fabric base and thermosetting resin composition is cut off by a sand blasting method, or the like, until the region of the metal plate which region is to constitute the semiconductor-chip-mounting portion is reached and exposed. The bonding pad of the first level and a circuit are formed on the front surface, and on the reverse surface, the solder ball pads for connecting the metal foil with which the metal protrusions having the form of frustum of a cone each are in contact to heat-diffusing solder balls and a circuit are formed. At least the semiconductor chip, the wire bonding pads and the solder ball pads are coated with a plating resist, and plating with nickel and gold is carried out, to complete the printed wiring board.

In the present invention, the method of preparing the metal plate is not critical. For example, a metal plate, a glass fabric base impregnated with a thermosetting resin composition and a copper foil are laminated in this order, to obtain a copper-clad laminate, an etching resist is applied onto the entire surface of the laminate, the etching resist present in a region of the exposed metal plate surface which region is to constitute metal protrusions having the form of frustum of a cone each and present on the copper foil on a front surface are retained, the rest of the etching resist is removed, and both sides of the laminate are etched to form an elevated portion in the region which is to constitute the metal protrusions. The plating resist is peeled off, and then the entire surface is coated with a plating resist. When the bonding pad portion of the second level is required, a circuit of the second level bonding pad is formed on the front surface. On the reverse surface, the etching resist is retained in the form of circles having small diameters on the elevated portion of the metal plate and the etching resist is retained so as to form a circuit on the other region. Etching is carried out so as to form a circuit and metal protrusions having the form of frustum of a cone each. The size of the above metal protrusions is not specially limited, while the top of each protrusion having the form of frustum of a cone has a diameter of 0 to 1 mm, and the bottom of each protrusion has a diameter of 0.5 to 5 mm.

The double-side metal-clad laminate having the above metal protrusions on one surface and circuits on both the surfaces are surface-treated by a known method as required. The surface treatment includes oxidation treatment, fine-roughening treatment and formation of a coating for improving adhesion and insulation. A heat-conductive adhesive or a solder may be applied to tops of the above metal protrusions. On the so-treated reverse surface of the metal plate, a glass fabric base prepreg sheet having a hole made a little larger than the area of the metal protrusions is placed. The glass fabric base prepreg sheet has a thickness such that its upper surface is on a level lower than the level of peaks of the metal protrusions after a laminate is formed under heat and pressure. A copper foil is placed on the glass fabric base prepreg sheet, and the resultant set is formed into a laminate under heat and pressure preferably in vacuum, such that top edges of the protrusions of the metal plate cut into the copper foil or comes in contact with the copper foil tightly. These members are accordingly integrated to give a double-side copper-clad multi-layered board. In this case, it is preferred to use a glass fabric base prepreg sheet in view of strength, while an organic base prepreg or other prepreg may be used.

In the printed wiring board having the bonding pad of the second level in the present invention 2, a glass fabric base prepreg sheet having a hole made a little larger than the area of the metal protrusions having the form of frustum of a cone each is placed on the protrusion side of the metal plate, a metal foil is placed on the prepreg sheet, a glass fabric base prepreg sheet is placed on the front surface having a region where a semiconductor chip is to be mounted, and a copper foil is placed on the prepreg. The resultant set is formed into a laminate under heat and pressure preferably in vacuum, such that top edges of the protrusions of the metal plate cut into the copper foil or comes in contact with the copper foil tightly. These members are accordingly integrated to give a double-side metal-clad multi-layered board.

When a penetration hole for a through hole is made in the above double-side copper-clad multi-layered board with a mechanical drill or a laser, and when the region where a semiconductor chip is to be mounted is formed so as to be isolated from a circumferential metal foil, the penetration hole is made so as to be partly in contact with the metal for using the circumferential metal foil as a circuit, and the penetration hole is placed to form a through hole. When a metal portion where a semiconductor chip is to be mounted is connected to a circumferential metal, the penetration hole is made so as not be in contact with the metal, and the entire wall of the penetration hole is plated. On the reverse surface, preferably, ball pads are formed in a portion where the top edges of the metal protrusions having the form of frustum of a cone each are in contact with a copper foil forming the outer surface or in a portion other than the above portion. In this case, a circuit is formed on the entire surface by a known method such that the ball pads are connected to the copper foil on the metal protrusions with the circuit.

On the front surface, copper foil, glass fabric base and thermosetting resin above a region where a semiconductor chip is to be mounted are cut off by a spot facing method, a sand blasting method or the like until the metal plate located as an inner layer is reached, to expose the metal plate, whereby a cavity type base board is obtained. Circuits are formed on the front and reverse surfaces, and at least a bonding pad portion and a solder ball pad portion on the front and reverse surfaces are coated with a plating resist. Nickel and gold plating is carried out, to obtain a printed wiring board. When the printed wiring board is produced, the circuits may be formed on the front and reverse surfaces prior to the cutting with a sand blasting method. In this case, the circuits on the front and reverse surfaces are coated with a protective resist or a protective metal before the sand blasting. When a noble metal plating is carried out, there may be employed a constitution in which the entire surface is plated with a noble metal and a portion on which the plating is not necessary is coated with a permanent protective coating.

In the present invention 2, on the front surface, metal foil, glass fabric base and thermosetting resin above a region where a semiconductor chip is to be mounted and the wire bonding pad portion of the second level are cut off by spot facing, laser or sand blasting method until the bonding pad of the second level is exposed, and then a remainder on the region where a semiconductor chip is to be mounted is cut off until the metal plate located as an inner layer is reached, to expose the metal plate, whereby a base board having a semiconductor-chip-mounting portion formed in the form of a cavity is produced. In this case, the bonding pad of the second level is prepared preferably by a sand blasting method in view of accuracy.

Then, a semiconductor chip is fixed to the semiconductor-chip-mounting portion on the front surface with a heat-conductive adhesive, followed by wire bonding and encapsulation with a resin. On the reverse surface, solder balls are melted and connected, whereby a semiconductor plastic package is obtained. The solder ball pad portion of the reverse surface is connected to a mother board printed wiring board with the solder balls.

Heat generated from the semiconductor chip is thermally conducted from the semiconductor-chip-mounting portion to the solder ball pads through the protrusions of the metal plate and diffused into the mother board printed wiring board which is connected to the solder ball pads with the solder balls.

Side surfaces of the meal plate may have any structure, such as a structure in which they are filled with a thermosetting resin composition or they are exposed. In view of prevention of rust, the side surfaces are preferably filled with a thermosetting resin composition.

A hole for a through hole for connecting the circuits on the front and reverse surfaces is made nearly in the center of a resin-filled clearance hole or slit of the metal plate so as not to be in contact with the metal plate when the semiconductor-chip-mounting portion of the metal plate is in contact with a circumferential metal plate. The wall of the hole is plated to form a metal layer by electroless plating or electric plating, to form a plated through hole. In a structure where the semiconductor-chip-mounting portion and the circumferential metal plate are isolated from each other, the circumferential metal plate can be used as a circuit, so that the through hole is made so as connect the circuit.

The sand blasting method may be any generally known sand blasting method. Specifically, it includes a dry type air blasting method, a shot blasting method and a wet type wet blasting method. A powder used in the above method is selected as required. Preferably, a known powder such as silica sand or glass powder having a size of 20 $\mu$m or less can be used. The pressure therefor is not critical, and the sand blasting is carried out generally at 0.1 to 0.5 MPa.

After the circuits on the front and reverse surfaces are formed, a noble metal plating is formed at least on the surfaces of the semiconductor-chip-mounting portion, the bonding pad portion and the solder ball pad portion, whereby the printed wiring board is completed. In this case, a portion where no noble metal plating is required is coated with a plating resist beforehand. Otherwise, after the plating is carried out, a coating is formed on a surface other than the surfaces of the semiconductor-chip-mounting portion, the bonding pad portion and the solder ball pad portion.

When the wire bonding is carried out, a semiconductor chip is fixed to the flat metal plate as an inner layer of the printed wiring board with a heat-conductive adhesive, the semiconductor chip and the bonding pad of circuit of the printed wiring board are connected by a wire bonding method, and at least the semiconductor chip, the bonding wire and the bonding pad are encapsulated with a known sealing resin. In the present invention 2, the semiconductor chip and the bonding pads of the first and second levels are connected by a wire bonding method.

Solder balls are connected to the conductor pad for connecting solder balls on the reverse surface opposite to the surface where the semiconductor chip is mounted, whereby P-BGA is obtained. The solder balls are brought into contact with a circuit of a mother board printed wiring board and melted by heat to be connected to the circuit. In PLGA, a conductor pad formed on the surface of a mother board printed wiring board for connecting solder balls and a conductor pad for solder balls for P-LGA are connected to each other by melting the solder balls.

The metal plate (also referred to as "metal foil" or "copper foil") used in the present invention is not specially limited, while the metal plate has a high elastic modulus and high heat conductivity, and the thickness of the metal plate is preferably 100 to 400 $\mu$m, more preferably 5 to 200 $\mu$m. Specifically, preferred is pure copper, oxygen-free copper or an alloy of copper with any one of Fe, Sn, P, Cr, Zr, Zn or the like. An alloy plated with copper may be also used. Generally, a known copper foil is used as such. Preferably, as a copper foil, an electrolytic copper foil having a thickness of 3 to 18 $\mu$m is used.

The height of the metal protrusions having the form of frustum of a cone each is not critical. Preferably, the metal protrusions have a height hither than the level of the surface of the metal plate as a base by 50 to 150 $\mu$m. Further, the thickness of an insulation layer such as a prepreg sheet is slightly smaller than the height of the above metal protrusions after a laminate is formed under heat and pressure, and the above thickness is preferably smaller by 5 to 10 $\mu$m. After the laminate is formed under heat and pressure, a resin is filled among the metal protrusions, among lines of a circuit and in the clearance hole or slit. Top edges of the above metal protrusions are at least in contact with, and connected to, part of a copper foil forming an outer layer.

The region where the metal protrusions having the form of frustum of a cone each is formed has an area approximately equivalent to the area of a semiconductor chip, and generally, the region has an area of 5×20 mm or smaller. Preferably, the ball pads are formed where the copper foil is not in contact with the metal protrusions of the metal plate reverse surface, and the ball pads are connected to the metal foil on the protrusions with a circuit, whereby the adhesion strength between the ball pad portion and the board can be retained and the peel strength (ball shear strength) when a force is laterally exerted on the balls can be retained.

The resin for the thermosetting resin composition used in the present invention can be selected from generally known thermosetting resins. Specifically, the resin includes an epoxy resin, a polyfunctional cyanate ester resin, a polyfunctional maleimide-cyanate ester resin, a polyfunctional maleimide resin and an unsaturated-group-containing polyphenylene ether resin. These resins may be used alone or in combination. In view of heat resistance, humidity resistance, anti-migration properties and electric properties after moisture absorption, a polyfunctional cyanate ester resin compound is preferred.

The polyfunctional cyanate ester compound which is a preferred thermosetting resin component in the present invention refers to a compound having a molecule containing at least two cyanato groups. Specific examples of the cyanate ester compound include 1,3- or 1,4-dicyanatobenzene, 1,3,5-tricyanotobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-dicyanatophenyl)methane, 2,2-bis (4-cyanatophenyl) propane, 2,2-bis(3,5-dibromo-4-cyanatophenyl) propane, bis(4-cyanatophenyl)ether, bis(4-cyanatophenyl) thioether, bis(4-cyanotophenyl)sulfone, tris(4-cyanatophenyl) phosphite, tris(4-cyanatophenyl) phosphate and cyanates obtained by a reaction between novolak and cyan halide.

Further, there may be used polyfunctional cyanate ester compounds disclosed in Japanese Patent Publications Nos. 41-1928, 43-18468, 44-4791, 45-11712, 46-41112 and 47-26853 and JP-A-51-63149. Further, there may be used a prepolymer having a molecular weight of 400 to 6,000 and having a triazine ring formed by dimerizing cyanate groups of any one of these polyfunctional cyanate ester compounds. The above prepolymer can be obtained by polymerizing the above polyfunctional cyanate ester monomer in the presence of a catalyst selected from acids such as mineral acid and Lewis acid, bases such as sodium alcoholate and tertiary amines, or salts such as sodium carbonate. The prepolymer partially contains unreacted monomer and has the form of a mixture of a monomer and a prepolymer, and the prepolymer in the above form is also suitably used in the present invention. Generally, the prepolymer is used in the form a solution thereof in an organic solvent in which it is soluble.

The epoxy resin can be selected from generally known epoxy resins. Specific examples thereof include a liquid or solid bisphenol A type epoxy resin, a bisphenol F type epoxy resin, a phenol novolak type epoxy resin, a cresol novolak type epoxy resin, an alicyclic epoxy resin; a polyepoxy compound obtained by epoxidizing the double bond of butadiene, pentadiene, vinylcyclohexene or dicyclopentyl ether; a polyol, and a polyglycidyl compound obtained by a reaction between a hydroxyl-group-containing silicone resin and epohalohydrin. These resins may be used alone or in combination.

The polyimide resin is generally selected from known polyimide resins. Specifically, it is selected from reaction products from polyfunctional maleimides and polyamines, and particularly from, polyimides having terminal triple bonds, disclosed in JP-B-57-005406.

The above thermosetting resins may be used alone, while it is preferred to use them in combination as required in view of the balance of properties.

Various additives may be incorporated into the thermosetting resin composition in the present invention so long as the inherent properties of the composition are not impaired. The above additives include monomers having polymerizable double bonds such as unsaturated polyester, prepolymers of these; liquid elastic rubbers having a low molecular weight or elastic rubbers having a high molecular weight such as polybutadiene, epoxidized butadiene, maleated butadiene, a butadiene-acrylonitrile copolymer, polychloroprene, a butadiene-styrene copolymer, polyisprene, butyl rubber, fluorine rubber and natural rubber; polyethylene, polypropylene, polybutene, poly-4-methylpentene, polystyrene, AS resin, ABS resin, MBS resin, styrene-isoprene rubber, a polyethylene-propylene copolymer, a 4-fluoroethylene-6-fluoroethylene copolymer; high-molecular-weight prepolymers or oligomers such as polycarbonate, polyphenylene ether, polysulfone, polyester and polyphenylene sulfide; and polyurethane. These additives are used as required. Further, various known additives such as an inorganic or organic filler, a dye, a pigment, a thickener, a lubricant, an anti-foamer, a dispersing agent, a leveling agent, a photo-sensitizer, a flame retardant, a brightener, a polymerization inhibitor and a thixotropic agent may be used alone or in combination as required. A curing agent or a catalyst is incorporated into a compound having a reactive group as required.

The thermosetting resin composition used in the present invention undergoes curing itself under heat. However, when it is poor in workability and economic performances, etc., due to its low curing rate, a known heat-curing catalyst is incorporated into the thermosetting resin. The amount of the catalyst per 100 parts by weight of the thermosetting resin is 0.005 to 10 parts by weight, preferably 0.01 to 5 to parts by weight.

The glass fabric base material used as a reinforcement for the prepreg is selected from generally known woven and non-woven fabrics, while a woven fabric is preferred in view of a strength. Specifically, it is selected from a know glass fiber fabric of E glass, S glass, D glass or the like. These fabrics may be a fabric obtained by intertwining different glass fibers. Further, an organic base material may be used, and it is selected from a generally known woven or non-woven fabric of a liquid crystal polymer fiber or an wholly aromatic polyamide fiber.

The diameter of the clearance hole or the width of the slit made in the metal plate is a little larger than the diameter of the through hole for conduction between the front and reverse surfaces. Specifically, the wall of the through hole is preferably insulated with the thermosetting resin composition so as to have a distance of at least 50 $\mu$m from the wall of the clearance hole or the slit made in the metal plate. Although not specially limited, the diameter of the through hole for conduction between the front and reverse surfaces is preferably 50 to 300 $\mu$m.

When the prepreg for the printed wiring board of the present invention is prepared, the base material is impregnated with the thermosetting resin composition, and the thermosetting resin composition is dried to obtain a semi-cured laminating material. A semi-cured resin layer of the prepreg is formed generally at 100 to 180° C., and the time period is 5 to 60 minutes. These conditions are properly selected depending upon an intended flow degree.

In the present invention 1, the method of preparing the metal plate and the method of producing the printed wiring board having the metal plate, for a semiconductor plastic package, are not specially limited. For example, the above metal plate and the printed wiring board are produced, for example, by the following method (FIGS. 1 and 2).

(1) A glass fabric base material (b in FIG. 1) double-side metal-foil-clad laminate is prepared. The laminate has a metal plate (a in FIG. 1) exposed on one surface.

(2) The entire surface is coated with an etching resist, etching resist is retained on a region where the metal protrusions are to be formed and the entire surface opposite to the surface having the above region, and etching is carried out until an elevated portion (c in FIG. 1) is formed in a central area on the side opposite to the side where a semiconductor-chip-mounting portion is to be formed. In a circumferential area, the metal plate, i.e., a metal foil, is retained so as to have a height little lower than the height of the elevated portion, and the plating resist is removed.

(3) The entire surface is again coated with a plating resist, and on the elevated portion, resist is retained in an area where a plurality of the metal protrusions are to be formed, such that the resist has a plurality of circular forms having a small diameter. The resist is also retained in a portion where a circuit is to be formed. Etching is carried out to form a board having the metal protrusions (d in FIG. 1) in the central area and having the circuit (e in FIG. 1) on one surface. The metal foil surface is oxidation-treated to form a black copper oxide.

When a metal foil portion where the metal protrusions are present is viewed from below, the semiconductor-chip-mounting portion which is present in the central area and has the metal protrusions on the reverse surface has a form (3-2; f) in which it is isolated from metal foil having a circumferential circuit formed thereon.

(4) A glass fabric base material prepreg sheet (g in FIG. 1) is placed on the reverse surface. The glass fabric base material prepreg sheet has a hole which corresponds to an area of the metal protrusions in the center and is a little larger than the above area. A copper foil (h in FIG. 1) is placed on each of the front and reverse surfaces.

(5) The above-prepared set is formed into a laminate under heat and pressure and in vacuum to obtain a double-side copper-clad multi-layered board (i in FIG. 1).

(6) A through hole (k in FIG. 2) for conduction between circuits on the front and reverse surfaces is made with a mechanical drill, and after desmear treatment, the entire surface is plated with copper. Copper foil on the semiconductor-chip-mounting portion on the front surface side is removed by etching, and glass fabric base material and thermosetting resin composition on the front surface side are cut off from the front surface side by a sand blasting method until a metal surface (j in FIG. 2) which constitutes the semiconductor-chip-mounting portion is reached.

(7) Circuits are formed on the front and reverse surfaces, the semiconductor-chip-mounting portion and the bonding pad portion on the front surface and a reverse surface portion other than the solder ball pad portion are coated with a plating resist (p in FIG. 2), and nickel plating and gold plating are carried out, to obtain a printed wiring board. A semiconductor chip (1 in FIG. 2) is fixed on the semiconductor-chip-mounting portion formed of the exposed portion of the metal plate with a heat-conductive adhesive, connected with a bonding wire (n in FIG. 2) and encapsulated with a resin (o in FIG. 2), and solder balls (q in FIG. 2) are bonded and fixed to the solder ball pads by melting them, to give a semiconductor plastic package.

Figure 3:
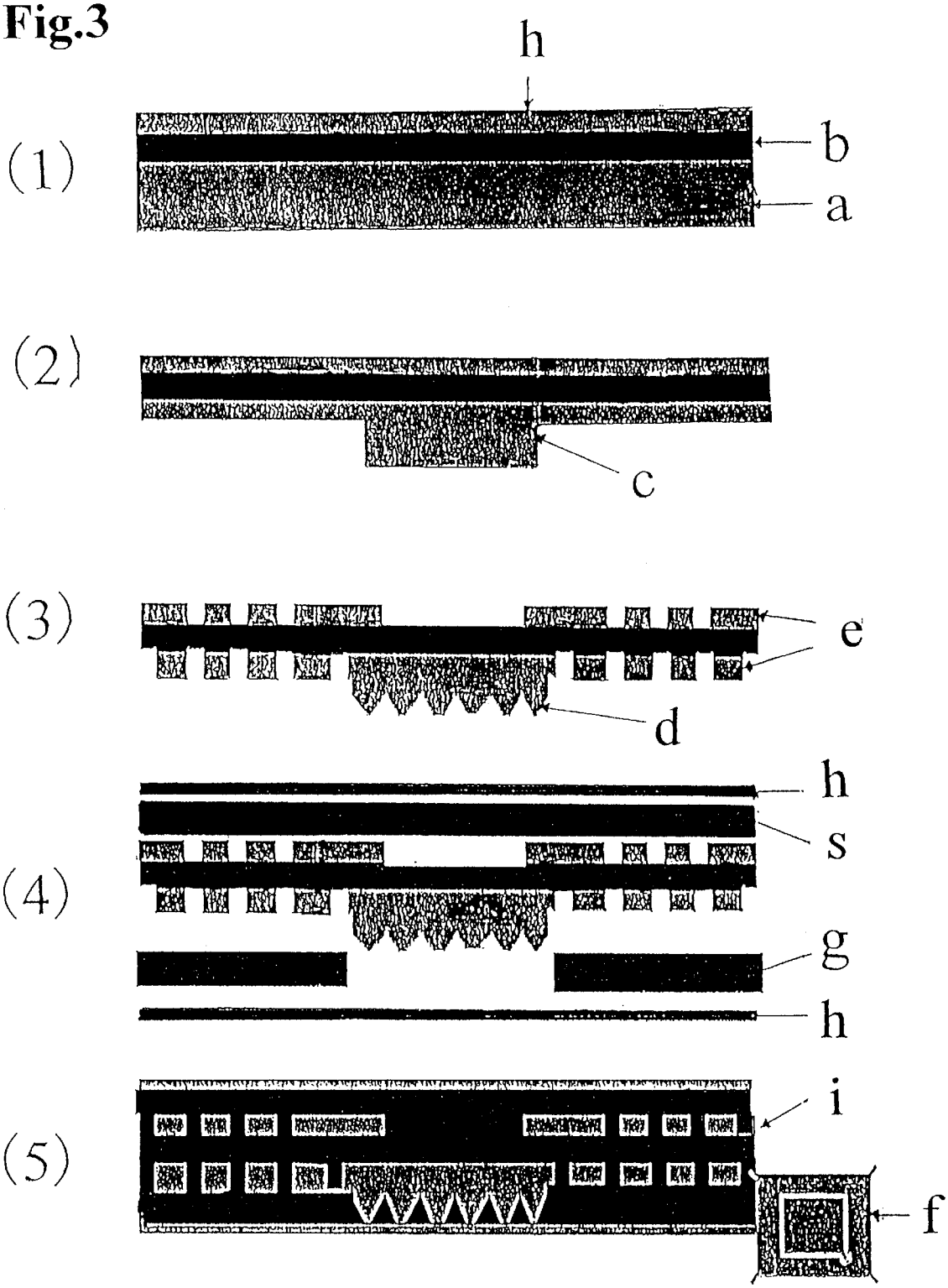
FIG. 3 shows steps of producing a printed wiring board for use in a metal-core-inserted ball grid array type semiconductor plastic package in Example 2.
Figure 4:
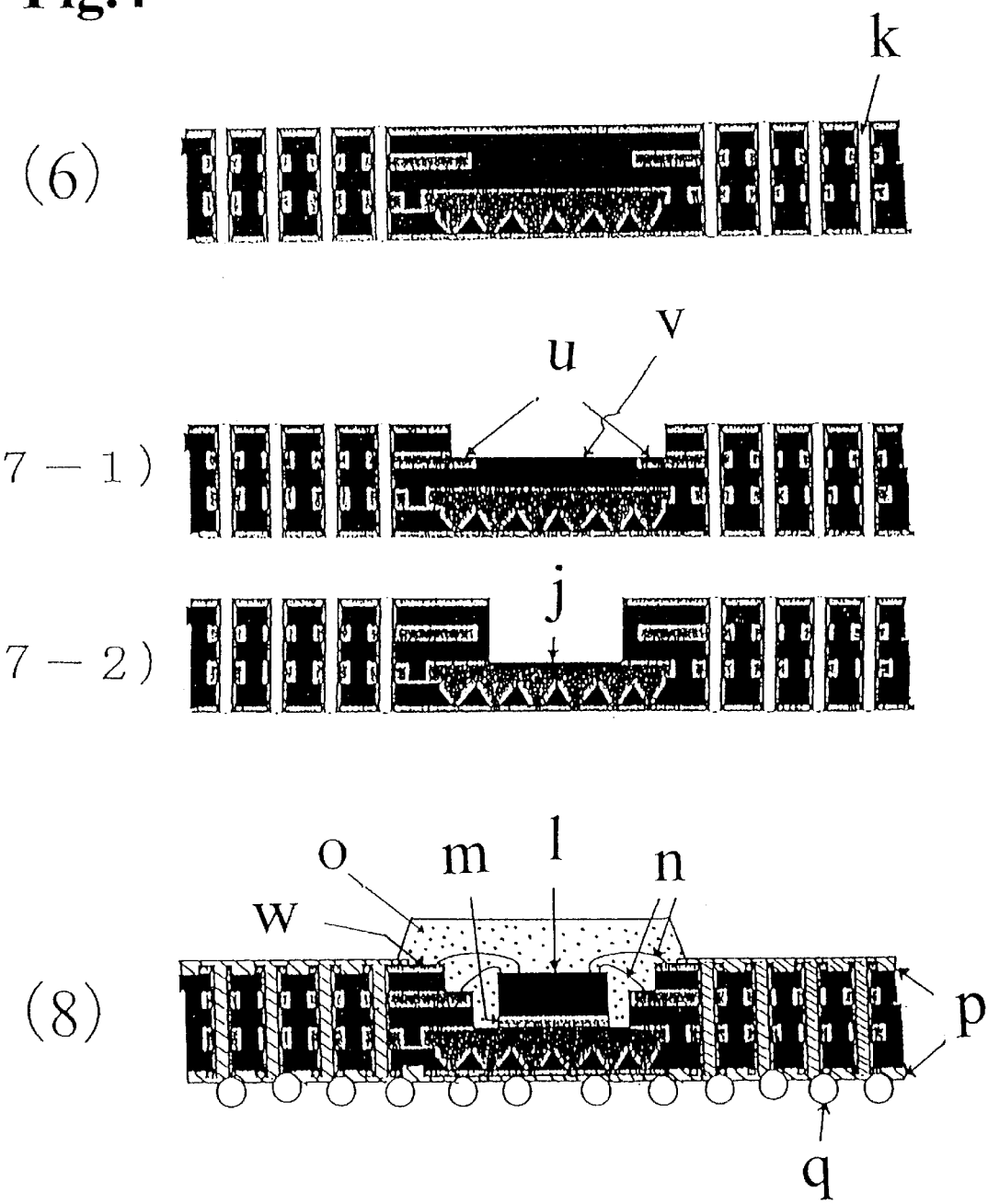
FIG. 4 shows steps of producing a printed wiring board for use in a metal-core-inserted ball grid array type semiconductor plastic package in Example 2.
Figure 5:
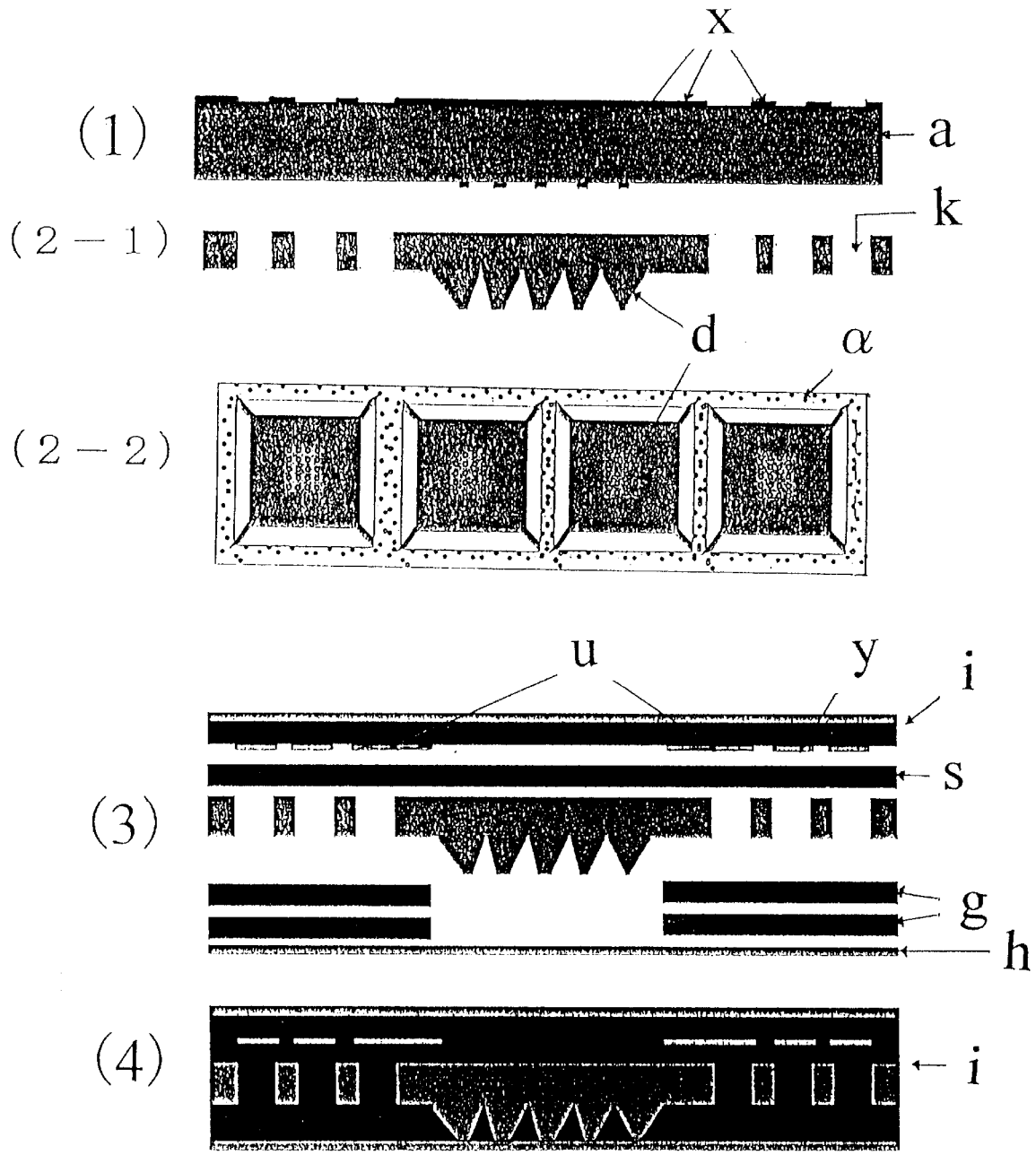
FIG. 5 shows steps of producing a semiconductor plastic package using a printed wiring board of the present invention for a metal-core-inserted ball grid array.

In the present invention 2, the method of preparing the metal plate and the method of producing the printed wiring board having the metal plate, for a semiconductor plastic package, are not specially limited. For example, the above metal plate and the printed wiring board are produced, for example, by the following method (FIGS. 3 and 4).

(1) A glass fabric base material/double-side metal-clad laminate is provided. The metal plate forming one surface of the laminate has a larger thickness than the metal plate forming the other surface.

(2) The entire surface of the laminate is coated with an etching resist, etching resist is retained in that surface region of the thicker metal plate which is the region where an elevated portion is to be formed, and etching resist is retained on the entire outer surface of the thinner metal plate. Etching is carried out in the reverse surface until the elevated portion (c) is formed in the central region of the reverse surface which central region is opposite to the area of a semiconductor-chip-mounting portion and until metal plate other than the elevated portion has a thickness a little smaller than the height of the elevated portion. The plating resist is removed.

(3) The entire surface is coated with a plating resist, and on the elevated portion, resist is retained in an area where a plurality of the metal protrusions are to be formed, such that the resist has a plurality of circular forms having a small diameter. The resist is also retained in portions where circuits are to be formed. Etching is carried out from both sides to form a board having the metal protrusions (d) in the central area and having the circuits (e) on each surface. The metal plate surfaces are oxidation-treated to form a black copper oxide. When a metal plate portion where the metal protrusions are present is viewed from below, the semiconductor-chip-mounting portion which is present in the central area and has the metal protrusions on the reverse surface has a form (f) in which, except some part, it is isolated from metal plate having a circumferential circuit formed thereon. In some case, the semiconductor-chip-mounting portion is not isolated.

(4) A glass fabric base material prepreg sheet (g) is placed on the reverse surface. The glass fabric base material prepreg sheet has a hole which corresponds to an area of the metal protrusions in the center and is a little larger than the above area. A copper foil (h) is placed thereon. A prepreg (s) having no hole is placed on the front surface, and a metal foil (h) is placed thereon.

(5) The above-prepared set is formed into a laminate under heat and pressure and in vacuum to obtain a double-side metal-clad multi-layered board (i).

(6) A through hole for conduction between circuits on the front and reverse surfaces is made with a mechanical drill, and after desmear treatment, the entire surface is plated with copper, and circuits are formed on the front and reverse surfaces (FIG. 4-(6)).

(7) Metal foil on a region where a semiconductor chip is to be mounted and on a bonding pad region is removed by etching, and glass base material and thermosetting resin composition are cut off from the front surface side by a sand blasting method until a bonding pad (u) of the second level is reached (FIG. 4-(7-1)).

(8) Any portion other than the semiconductor-chip-mounting portion is coated with a protective resist, and a non-coated portion is cut off by a sand blasting method until the metal plate is reached, to expose a flat metal surface (j) which constitutes the semiconductor-chip-mounting portion.

A portion which is different from any of the exposed metal surface which constitutes the semiconductor-chip-mounting portion and has the form of a cavity, the bonding pad portions of the first and second levels and the solder ball pad portion on the reverse surface is coated with a plating resist (p), and nickel plating and gold plating are carried out, to obtain a printed wiring board. A semiconductor chip (1) is fixed on the semiconductor-chip-mounting portion (j) formed of the exposed surface of the metal plate with a heat-conductive adhesive, connected with a bonding wire (n) and encapsulated with a resin (o), and solder balls (q) are bonded and fixed to the solder ball pads by melting them, to give a semiconductor plastic package.

According to the present invention, there is provided a method of producing a printed wiring board having a novel structure for a semiconductor plastic package, which is excellent in strength of adhesion to solder balls, which is free of moisture absorption from the lower surface of a semiconductor chip, which is greatly improved in heat resistance after moisture absorption, i.e., does not cause a popcorn phenomenon, and which is suitable for mass production and improved in economic performances. Further, there is also provided a method of producing a printed wiring board for a semiconductor plastic package, which is excellent in insulation properties after pressure cooker treatment and anti-migration properties.

EXAMPLES

The present invention will be explained more in detail with reference to Examples hereinafter, in which "part" stands for "part by weight" unless otherwise specified.

Example 1

900 Parts of 2,2-bis(4-cyanatophenyl)propane and 100 parts of bis(4-maleimidophenyl methane) were melted to 150° C. and allowed to react for 4 hours with stirring, to give a prepolymer. The prepolymer was dissolved in mixed solvents of methyl ethyl ketone and dimethylformamide. To the resultant mixture were added 400 parts of a bisphenol A type epoxy resin (trade name: Epikote 1001, supplied by Yuka-Shell Epoxy K.K.) and 600 parts of a cresol novolak type epoxy resin (trade name: ESCN-220F, supplied by Sumitomo Chemical Industry Co., Ltd.), and these materials were homogeneously dissolved and mixed. Further, as a catalyst, 0.4 part of zinc octylate was added, dissolved and mixed. To the resultant mixture were added 500 parts of an inorganic filler (trade name: Calcined Talc, supplied by Nippon Talc K.K.), and these materials were homogeneously stirred and mixed to prepare a varnish A. A 50 $\mu$m thick glass woven fabric was impregnated with the above varnish, and the impregnated glass woven fabric was dried to prepare a semi-cured prepreg (prepreg B) having a gelation time of 50 seconds (at 170° C.) and having a resin flow of 8 mm at 170° C. at kgf/cm$^2$ for 5 minutes. The prepreg B had an insulation layer thickness of 88 $\mu$m.

A 18 $\mu$m thick electrolytic copper foil was placed on one surface of a sheet of the above prepreg B, a 105 $\mu$m thick electrolytic copper foil was placed on the other surface, and the resultant set was formed into a laminate at 200° C. at kgf/cm$^2$ for 2 hours, to give a double-side copper-clad laminate. The entire surface of the laminate was coated with an etching resist having a thickness of 25 $\mu$m, etching resist on the entire surface of the 18 $\mu$m thick copper foil was retained, and on the 105 $\mu$m thick copper foil side, etching resist was retained so as to cover an area where an elevated portion was to be formed. Etching was carried out to give a double-side copper clad-laminate having an elevated portion (c) on one surface (FIG. 1-(2)). The retained resist was removed, the entire surface was coated with a liquid etching resist having a thickness of 25 $\mu$m, 400 resist circles having a diameter of 250 $\mu$m were retained on the elevated portion opposite to a 15×15 mm square area which was to be located in a central area of a 50×50 mm package area and which was to constitute a semiconductor-chip-mounting portion, resist was retained in a circumferential area around the elevated portion, and etching was carried out to form 400 protrusions (d) having the form of frustum of a cone each and a circuit (e) in an circumferential area (FIG. 1-(3-1)). Each protrusion had a height of 85 $\mu$m from the base copper foil surface, a bottom side diameter of 507 $\mu$m and a top side diameter of 108 $\mu$m. A copper foil portion which was to constitute a semiconductor-chip-mounting portion having the protrusions on its reverse surface had a structure (f) where it was isolated from a copper foil for forming a circumferential circuit.

The copper foil surface of the laminate was oxidation-treated to form a black copper oxide, and then one sheet of the above prepreg B (g) was placed on the reverse surface. The above prepreg B sheet had a hole which corresponded to an area of the metal protrusions and had an area little larger the area of the metal protrusions. A 18 $\mu$m thick electrolytic copper foil (h) was placed on the prepreg B sheet, and the resultant set was formed into a laminate and integrated, to give a double-side copper-clad multi-layered board (i).

Through holes having a diameter of 0.25 $\mu$m each were made with a mechanical drill, and after desmear treatment, the entire surface was copper-plated to form a 20 $\mu$m thick copper layer by electroless plating and electrolytic plating, whereby through hole conductors (k) were formed. Copper foil on the semiconductor-chip-mounting portion was removed by etching, and glass fabric base material and thermosetting resin composition were cut off from the front surface by a sand blasting method until a metal surface was reached. Sand used with the blasting method was removed through a soft etching step, and then, circuits were formed on the front and reverse surfaces. Solder ball pads on the reverse surface were formed so as not to overlap with the peaks of the metal protrusions. A plating resist (p) was formed on a portion which was not any of the semiconductor-chip-mounting portion, the wire bonding portion and ball pad portion on the reverse surface, and nickel plating and gold plating were carried out, to complete a printed wiring board. A semiconductor chip having a size of 13×13 mm was fixed to the flat inner layer metal plate portion which was the semiconductor chip mounting portion on the front surface, with a silver paste (m), and wire bonding was carried out. Then, the semiconductor chip (1), a wire (n) and the bonding pads were encapsulated with a resin, and solder balls (q) were bonded to the reverse surfaces, to complete a semiconductor plastic package. The semiconductor plastic package was connected to an epoxy resin mother board printed wiring board by melting the solder balls. Tables 1 and 2 show evaluation results.

Comparative Example 1

Two sheets of the prepreg B obtained in Example 1 were used as a laminate. A 12 μm thick electrolytic copper foil was placed on one surface of the laminate, and 12 μm thick electrolytic copper foil was also placed on the other surface. The resultant set was formed into a laminate at 200° C. at kgf/cm² under a vacuum 30 of mmHg or less, to give a double-side copper-clad laminate. Through holes having a diameter of 0.25 mm were made in predetermined positions with a drill, and after desmear treatment, copper plating was carried out. Circuits were formed on the front and reverse surfaces of the laminate by a known method, followed by coating with a plating resist and plating with nickel and gold. The resultant board had heat-diffusing through holes in a region where a semiconductor chip was to be mounted. A semiconductor chip was bonded to the region with a silver paste, followed by wire bonding and also followed by encapsulation with an epoxy sealing compound and connection with solder balls in the same manner as in Example 1. The resultant package was bonded to a mother board. Tables 1 and 2 show evaluation results.

Comparative Example 2

Figure 8:
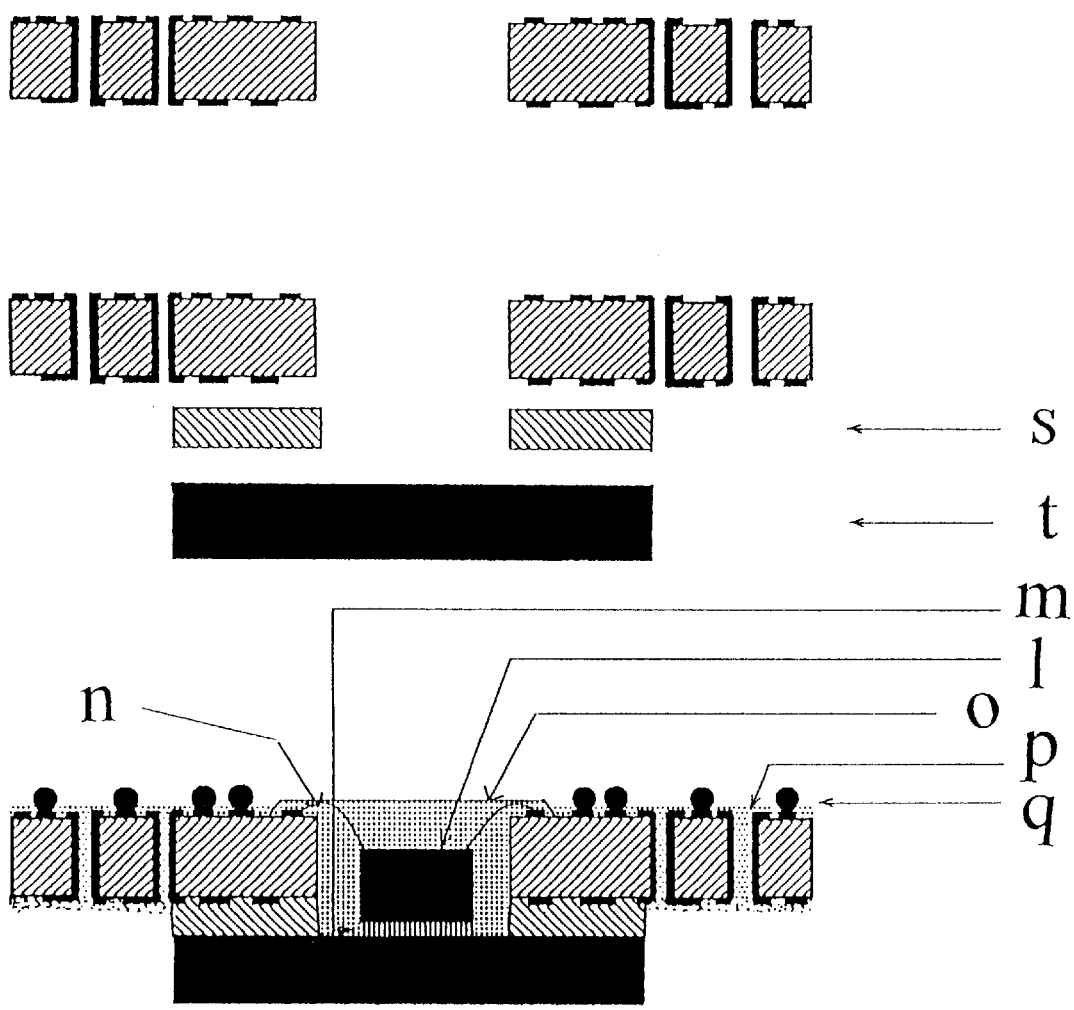
FIG. 8 shows steps of producing a semiconductor plastic package in Comparative Example 3.

300 Parts of an epoxy resin (trade name: Epikote 5045, supplied by Yuka-Shell Epoxy K.K.), 700 parts of an epoxy resin (trade name: ESCN220F, supplied by Sumitomo Chemical Industry Co., Ltd.), 35 parts of dicyandiamide and 1 part of 2-ethyl-4-methylimidazole were dissolved in mixed solvents of methyl ethyl ketone and dimethyl formamide. A glass woven fabric having a thickness of 100 μm was impregnated with the above mixture, and the impregnated glass woven fabric was dried to obtain a no-flow prepreg (prepreg C) having a gelation time of 10 seconds and a resin flow of 98 μm and a high-flow prepreg (prepreg D) having a gelation time of 150 seconds and a resin flow of 18 mm. Two sheets of the prepreg D were used, and a double-side copper-clad laminate was prepared by laminate-formation at 190° C. at kgf/cm² under a vacuum of 30 mmHg or less for 2 hours. Thereafter, a printed wiring board was prepared in the same manner as in Comparative Example 1, a hole was made in a portion for a semiconductor-chip-mounting portion with a spot facing machine, and a copper plate having a thickness 200 μm and a sheet of the above no-flow prepreg C having a central hole were laminated thereon. The resultant set was integrated under heat and pressure, to obtain a radiator-possessing printed wiring board. The so-obtained printed wiring board underwent distortion. A semiconductor chip was fixed directly to the radiator with a silver paste, followed by wire bonding and encapsulation with a liquid epoxy resin (FIG. 8). The resultant package was bonded to a mother board printed wiring board. Tables 1 and 2 show evaluation results.

TABLE 1

| | Example | Comparative Example | |
|---|---|---|---|
| | 1 | 1 | 2 |
| Ball shear strength (kgf) | 1.6 | — | — |
| Heat resistance A after moisture absorption | | | |
| Normal state | No failure | No failure | No failure |
| 24 hours | No failure | No failure | No failure |
| 48 hours | No failure | No failure | No failure |
| 72 hours | No failure | No failure | No failure |
| 96 hours | No failure | No failure | Partly peeled |
| 120 hours | No failure | Partly peeled | Partly peeled |
| 144 hours | No failure | Partly peeled | Partly peeled |
| 168 hours | No failure | Partly peeled | Partly peeled |
| Heat resistance B after moisture absorption | | | |
| Normal state | No failure | No failure | No failure |
| 24 hours | No failure | Partly peeled | Partly peeled |
| 48 hours | No failure | Largely peeled | Largely peeled |
| 72 hours | No failure | Wire broken | Wire broken |
| 96 hours | No failure | Wire broken | Wire broken |
| 120 hours | No failure | Wire broken | Wire broken |
| 144 hours | No failure | — | — |
| 168 hours | No failure | — | — |

TABLE 2

| | Example | Comparative Example | |
|---|---|---|---|
| | 1 | 1 | 2 |
| Insulation resistance value (Ω) after pressure cooker treatment | | | |
| Normal state | $5 \times 10^{14}$ | $1 \times 10^{14}$ | $6 \times 10^{14}$ |
| 200 hours | $5 \times 10^{12}$ | $4 \times 10^{12}$ | $5 \times 10^{8}$ |
| 500 hours | $4 \times 10^{11}$ | $3 \times 10^{11}$ | $<10^{8}$ |
| 700 hours | $2 \times 10^{10}$ | $2 \times 10^{10}$ | — |
| 1000 hours | $1 \times 10^{11}$ | $1 \times 10^{10}$ | — |
| Anti-migration properties (Ω) | | | |
| Normal state | $5 \times 10^{13}$ | $5 \times 10^{13}$ | $4 \times 10^{13}$ |
| 200 hours | $6 \times 10^{11}$ | $4 \times 10^{11}$ | $3 \times 10^{9}$ |
| 500 hours | $4 \times 10^{11}$ | $2 \times 10^{11}$ | $<10^{8}$ |
| 700 hours | $1 \times 10^{11}$ | $1 \times 10^{11}$ | — |
| 1000 hours | $6 \times 10^{10}$ | $6 \times 10^{11}$ | — |
| Glass transition temperature (° C.) | 234 | 234 | 160 |
| Heat diffusibility (° C.) | 30 | 54 | 48 |

<Measurement Methods>
1) Ball Shear Strength

A solder ball was bonded to a ball pad having a diameter of 0.65 mm, and laterally pressed to be peeled off. The ball was measured for a strength when it was peeled off.

2) Heat Resistance A After Moisture Absorption

A printed wiring board was treated at 30° C. at 60% RH for predetermined period of time according to JEDEC STANDARD TEST METHOD A113-A LEVEL 3 and then subjected to 3 cycles of a 220° C. reflow solder test, and the board was studied for any failure by observation of its cross section and electric checking.

3) Heat Resistance B After Moisture Absorption

A printed wiring board was treated at 85° C. at 60% RH for predetermined period of time (maximum 168 hours) according to JEDEC STANDARD TEST METHOD A113-A LEVEL 2 and then subjected to 3 cycles of a 220° C. reflow solder test, and the board was studied for any failure by observation of its cross section and electric checking.

4) Insulation Resistance Value After Pressure Cooker Treatment

An inter-terminal comb-shaped pattern (line/space=70/70 $\mu$m) was formed, prepreg sheets used were placed thereon, the resultant set was formed into a laminate, the resultant laminate was treated at 121° C. under 2 atmospheric pressures for a predetermined period of time and then treated at 25° C. at 60% RH for 2 hours, 500 VDC was applied, and 60 seconds after the application, an insulation resistance between terminals was measured.

5) Anti-migration Properties

50 VDC was applied to the same test piece as that in the above 4) at 85° C. at 85% RH, and an insulation resistance between terminals was measured.

6) Glass Transition Temperature

Measured according to a DMA method.

7) Heat Diffusibility

A package was bonded to an identical mother board printed wiring board with solder balls and continuously used for 1,000 hours, and the package was measured for a temperature.

Example 2

A 50 $\mu$m thick glass woven fabric was impregnated with the same varnish A as that obtained in Example 1, and the impregnated glass woven fabric was dried so as to obtain a semi-cured prepreg E having a gelation time of 50 seconds (at 170° C.) and a resin flow of 12 mm at 170° C. at 20 kgf/cm$^2$ for 5 minutes. The prepreg E had an insulation layer thickness of 137 $\mu$m.

A 35 $\mu$m thick electrolytic copper foil was placed on one surface of the above prepreg E, a 165 $\mu$m thick electrolytic copper foil was also placed on the other surface, and the resultant set was formed into a laminate at 200° C. at 20 kgf/cm$^2$ for 2 hours, to give a double-side copper-clad laminate. The entire surface of the laminate was coated with a 25 $\mu$m thick etching resist, etching resist was retained on the entire 35 $\mu$m thick copper foil side, and on the 165 $\mu$m thick copper foil side, etching resist was retained so as to cover an area where protrusions having the form of frustum of a cone were to be formed. Etching was carried out from both the surfaces, to give a double-side copper-clad laminate (FIG. 3-(2)) having an elevated portion (c) on one surface. The retained resist was removed, and the entire surface was again coated with a liquid etching resist to form a 25 $\mu$m thick etching resist layer. Then, 225 resist circles having a diameter of 250 $\mu$m were retained on the elevated portion opposite to a 15×15 mm square area which was to be located in a central area of a 50×50 mm package area and which was to constitute a semiconductor-chip-mounting portion, and resist was retained in a circumferential area around the elevated portion. On the front surface, resist was retained for forming bonding pads of a second level and a surface-layer circuit, and etching was carried out from both sides to form 225 protrusions (d) having the form of frustum of a cone each and circuits (e) in circumferential areas on the front and reverse surfaces (FIG. 1-(3)). Each protrusion had a height of 130 $\mu$m, a bottom portion diameter of 612 $\mu$m and a top portion diameter of 180 $\mu$m. A copper foil portion which was to constitute a semiconductor-chip-mounting portion having the protrusions on its reverse surface had a structure (f) where it was isolated from a copper foil for forming the circumferential circuit.

The copper foil surfaces of the laminate were oxidation-treated to form a black copper oxide, and then one sheet of the above prepreg E (s) was placed on the front surface side. A sheet of the above prepreg E sheet was also placed on the reverse surface. The latter sheet had a hole which corresponded to an area of the metal protrusions and had an area little larger the area of the metal protrusions. A 18 $\mu$m thick electrolytic copper foil (h) was placed on one of the sheets of the prepreg B, a 18 $\mu$m thick electrolytic copper foil (h) was placed on the other of the sheets of the prepreg E, and the resultant set was similarly formed into a laminate and integrated, to give a double-side copper-clad multi-layered board (i).

Through holes having a diameter of 0.25 $\mu$m each were made with a mechanical drill, and after desmear treatment, the entire surface was copper-plated to form a 20 $\mu$m thick copper layer by electroless plating and electrolytic plating, whereby through hole conductors (k) were formed. Circuits were formed on the front and reverse surfaces, and at the same time, copper foil on areas which were to constitute the semiconductor-chip-mounting portion and bonding pads of a second level was removed by etching, a surface which was not on a region to constitute the semiconductor-chip-mounting portion or the bonding pads of the second level was coated with a resist, and glass fabric base material and thermosetting resin composition were cut off from the front surface by a sand blasting method until a portion which was to constitute the bonding pads of the second level was reached. The resist was peeled off, any surface other than the region which was to constitute the semiconductor-chip-mounting portion was coated with a protective resist, glass fabric base material and thermosetting resin composition (v) were cut off by a sand blasting method until a metal core was reached, and the resist was peeled off. Then, sand used with the sand blasting method was removed through a soft etching step. Solder ball pads on the reverse surface were formed so as not to overlap with the peaks of the metal protrusions, but were formed so as to be connected to the copper foil on the protrusions. A plating resist (p) was formed on a portion which was not any of the semiconductor-chip-mounting portion, the wire bonding portion and a ball pad portion on the reverse surface, and nickel plating and gold plating were carried out, to complete a printed wiring board. A semiconductor chip having a size of 13×13 mm was fixed to the flat inner-layer metal core which was the semiconductor chip mounting portion on the front surface, with a silver paste (m), and wire bonding on the first and second levels was carried out. Then, the semiconductor chip (1), wires (n) and the bonding pads (w)

were encapsulated with a silica-containing sealing liquid resin (o), and solder balls (q) were bonded to the reverse surfaces, to complete a semiconductor plastic package. The semiconductor plastic package was connected to an epoxy resin mother board printed wiring board by melting the solder balls. Tables 3 and 4 show evaluation results.

Comparative Example 3

A semiconductor plastic package was prepared in the same manner as in Example 2 except that solder ball pads were formed on protrusions having the form of frustum of a cone each. Tables 3 and 4 show evaluation results.

Comparative Example 4

Two sheets of the prepreg E obtained in Example 2 were used as a laminate. A 12 μm thick electrolytic copper foil was placed on one surface of the laminate, and a 12 μm thick electrolytic copper foil was placed on the other surface, and the resultant set was formed into a laminate at 200° C. at kgf/cm² under a vacuum of 30 mmHg or less, to give a double-side copper-clad laminate. Through holes having a diameter of 0.25 mm were made in predetermined positions, and after desmear treatment, copper plating was carried out. Circuits were formed on the front and reverse surfaces by a known method, followed by coating with a plating resist, nickel plating and gold plating. The resultant board had heat-diffusing through holes in a region where a semiconductor chip was to be mounted. A semiconductor chip was bonded to the region with a silver paste, followed by wire bonding and encapsulation with an epoxy sealing compound in the same manner as in Example 2. Solder balls were connected (FIG. 8). The so-obtained package was similarly bonded to a mother board. Tables 3 and 4 show evaluation results.

TABLE 3

|  | Example | Comparative Example | |
| --- | --- | --- | --- |
|  | 2 | 3 | 4 |
| Ball shear strength (kgf) | 1.4 | 0.9 | — |
| Heat resistance A after moisture absorption | | | |
| Normal state | No failure | — | No failure |
| 24 hours | No failure | — | No failure |
| 48 hours | No failure | — | No failure |
| 72 hours | No failure | — | No failure |
| 96 hours | No failure | — | No failure |
| 120 hours | No failure | — | Partly peeled |
| 144 hours | No failure | — | Partly peeled |
| 168 hours | No failure | — | Partly peeled |
| Heat resistance B after moisture absorption | | | |
| Normal state | No failure | — | No failure |
| 24 hours | No failure | — | Partly peeled |
| 48 hours | No failure | — | Largely peeled |
| 72 hours | No failure | — | Wire broken |
| 96 hours | No failure | — | Wire broken |
| 120 hours | No failure | — | Wire broken |
| 144 hours | No failure | — | — |
| 168 hours | No failure | — | — |

TABLE 4

|  | Example | Comparative Example | |
| --- | --- | --- | --- |
|  | 2 | 3 | 4 |
| Insulation resistance value (Ω) after pressure cooker treatment | | | |
| Normal state | $5 \times 10^{14}$ | — | $6 \times 10^{14}$ |
| 200 hours | $7 \times 10^{12}$ | — | $5 \times 10^{12}$ |
| 500 hours | $8 \times 10^{11}$ | — | $4 \times 10^{11}$ |
| 700 hours | $3 \times 10^{10}$ | — | $5 \times 10^{10}$ |
| 1000 hours | $2 \times 10^{10}$ | — | $2 \times 10^{10}$ |
| Anti-migration properties (Ω) | | | |
| Normal state | $5 \times 10^{13}$ | — | $5 \times 10^{13}$ |
| 200 hours | $6 \times 10^{11}$ | — | $4 \times 10^{11}$ |
| 500 hours | $7 \times 10^{11}$ | — | $5 \times 10^{11}$ |
| 700 hours | $2 \times 10^{11}$ | — | $1 \times 10^{11}$ |
| 1000 hours | $8 \times 10^{10}$ | — | $8 \times 10^{10}$ |
| Glass transition temperature (° C.) | 234 | 234 | 234 |
| Heat diffusibility (° C.) | 30 | | 56 |

Example 3

Varnish A was prepared in the same manner as in Example 1. A 50 μm thick glass woven fabric was impregnated with the varnish A, and the impregnated glass woven fabric was dried so as to attain a gelation time of 50 seconds (at 170° C.) and a resin flow of 10 mm at 170° C. at 20 kgf/cm² for 5 minutes, whereby a semi-cured prepreg F ving an insulation layer thickness of 75 μm was obtained.

Separately, there was provided a 300 μm thick alloy plate which had contents of Cu: 99.9%, Fe: 0.07% and P:0.03% and was used as an inner-layer metal plate. A liquid etching resist was applied to the entire surface of the alloy plate to form a coating having a thickness of 25 μm. Then, 400 resist circles having a diameter of 250 μm were retained on a region opposite to a 15×15 mm square area which was to be located in a central area of a 50×50 mm package area and which was to constitute a semiconductor-chip-mounting portion. On the front surface, etching resist in an area where a clearance hole having a diameter of 0.6 mm was to be made was removed, and etching was carried out from both sides to form 400 protrusions having the form of frustum of a cone each on the reverse surface and a clearance hole in a circumferential area (FIG. 5 (1), (2-1)). Each protrusion had a height of 153 μm, a bottom portion diameter of 645 μm and a top portion diameter of 110 μm.

Separately, a 18 μm thick electrolytic copper foil was placed on one surface of a sheet of the above prepreg F, a 18 μm thick electrolytic copper foil was also placed on the other surface, and the resultant set was formed in a laminate at 200° C. at 20 kgf/cm² for 2 hours, to obtain a double-side copper-clad laminate (i). Bonding pads of a second level and other circuit were formed on one surface of the laminate, and the laminate was oxidation-treated to form a black copper oxide. The laminate was placed on the front surface of the above metal plate such that the circuit side faced inward. Two sheets of the above prepreg E (g) were placed on the reverse surface of the metal plate. These two sheets of the prepreg (E) had holes which corresponded to an area of the metal protrusions and had an area little larger the area of the metal protrusions. A 18 μm thick electrolytic copper foil was placed thereon, and the resultant set was similarly formed and integrated into a laminate.

Figure 6:
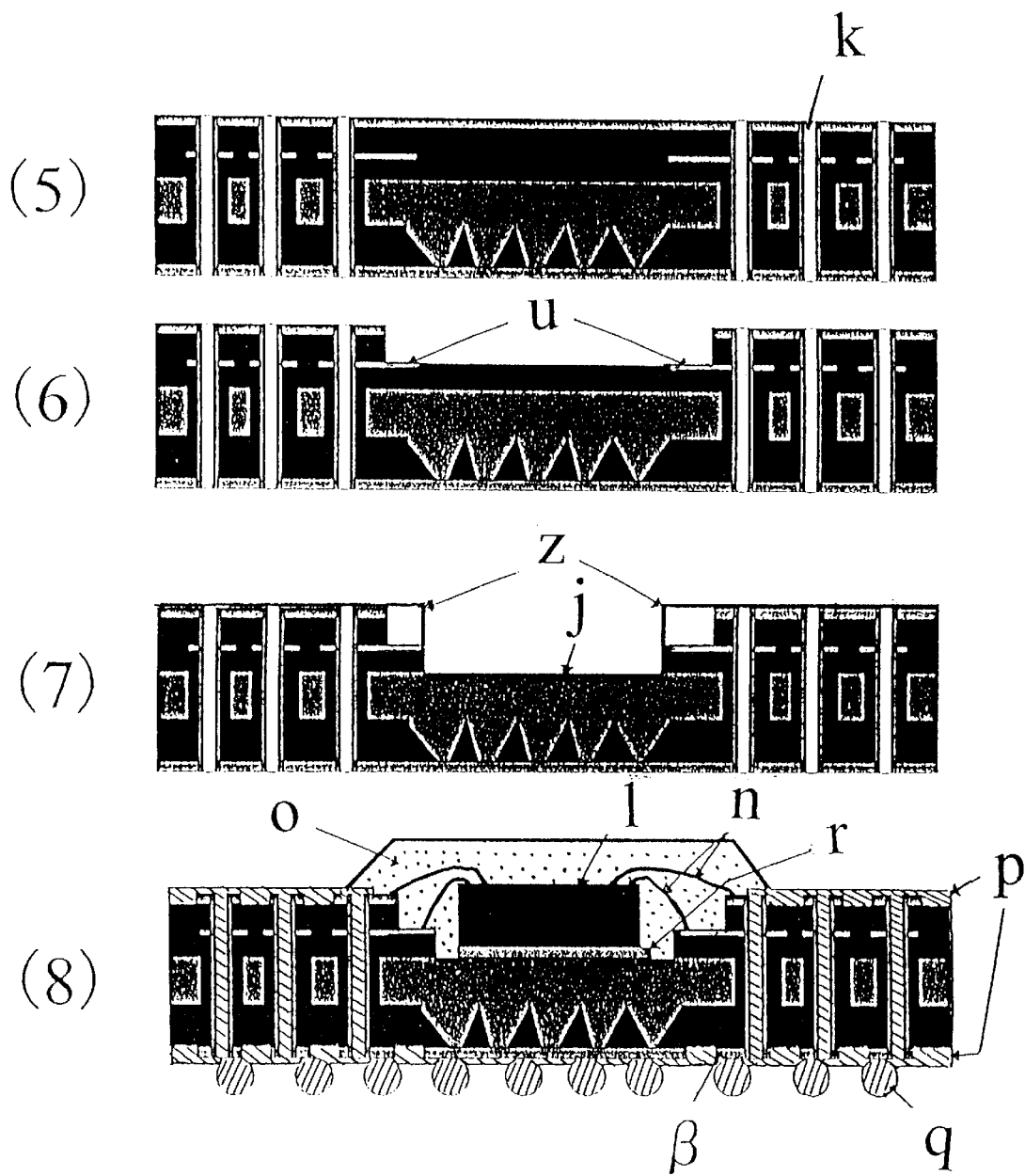
FIG. 6 shows steps of producing a semiconductor plastic package using a printed wiring board of the present invention for a metal-core-inserted ball grid array.
Figure 7:
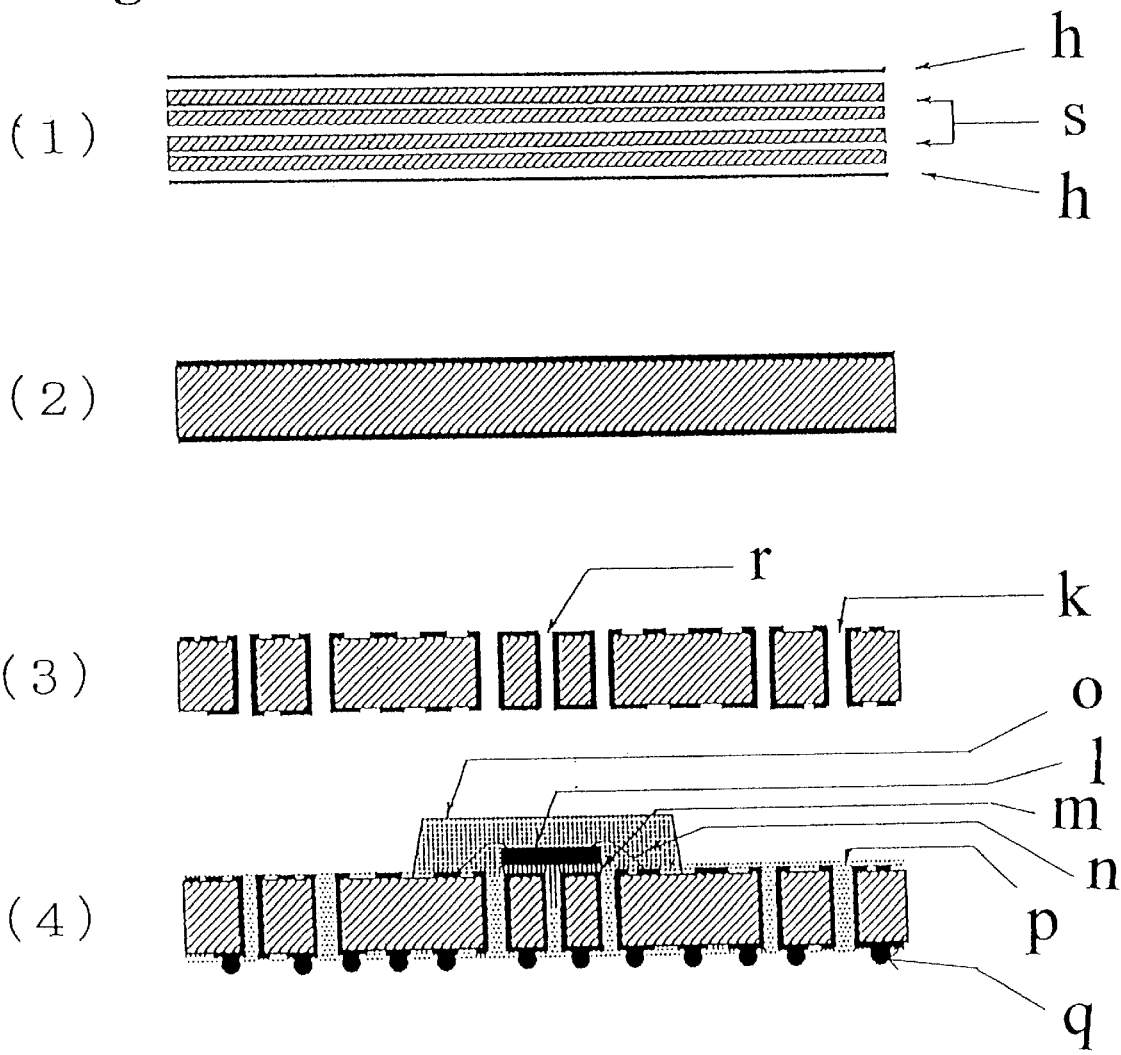
FIG. 7 shows steps of producing a semiconductor plastic package in Comparative Example 2.

Through holes having a diameter of 0.25 mm were made in a clearance hole portion with a mechanical drill, and after desmear treatment, the entire surface was copper-plated to form a 20 μm thick copper layer by electroless plating and electrolytic plating (FIG. 6(5)). Copper foil on areas which were to constitute the semiconductor-chip-mounting portion and bonding pads of a second level was removed by etching, and glass fabric base material and thermosetting resin composition were cut off from the front surface by a sand blasting method until a portion which was to constitute the bonding pads (u) of the second level was reached. Then, a metal protective sheet (z) was covered on the semiconductor-chip-mounting portion, glass fabric base material and thermosetting resin composition were again cut off by a sand blasting method until a metal core was reached. Then, sand used with the sand blasting method was removed through a soft etching step, and circuits were formed on the front and reverse surfaces. Solder ball pads (β) on the reverse surface were formed so as not to overlap with the peaks of the metal protrusions. A plating resist was formed on a portion which was not any of the semiconductor-chip-mounting portion, the wire bonding portion and a ball pad portion on the reverse surface, and nickel plating and gold plating were carried out, to complete a printed wiring board. A semiconductor chip (1) having a size of 13×13 mm was fixed to the flat inner-layer metal core which was the semiconductor chip mounting portion on the front surface, with a silver paste (r), and the semiconductor chip was connected to the bonding pads of the first and second levels by wire bonding. Then, the semiconductor chip, wires and the bonding pads were encapsulated with a silica-containing sealing liquid resin (o), and solder balls (q) were bonded to the reverse surfaces, to complete a semiconductor plastic package. The semiconductor plastic package was connected to an epoxy resin mother board printed wiring board by melting the solder balls. Tables 5 and 6 show evaluation results.

TABLE 5

|  | Example 3 |
| --- | --- |
| Ball shear strength (kgf) | 1.6 |
| Heat resistance A after moisture absorption | |
| Normal state | No failure |
| 24 hours | No failure |
| 48 hours | No failure |
| 72 hours | No failure |
| 96 hours | No failure |
| 120 hours | No failure |
| 144 hours | No failure |
| 168 hours | No failure |
| Heat resistance B after moisture absorption | |
| Normal state | No failure |
| 24 hours | No failure |
| 48 hours | No failure |
| 72 hours | No failure |
| 96 hours | No failure |
| 120 hours | No failure |

TABLE 5-continued

|  | Example 3 |
| --- | --- |
| 144 hours | No failure |
| 168 hours | No failure |

TABLE 6

|  | Example 3 |
| --- | --- |
| Insulation resistance value (Ω) after pressure cooker treatment | |
| Normal state | $5 \times 10^{14}$ |
| 200 hours | $7 \times 10^{12}$ |
| 500 hours | $8 \times 10^{11}$ |
| 700 hours | $3 \times 10^{10}$ |
| 1000 hours | $2 \times 10^{10}$ |
| Anti-migration properties (Ω) | |
| Normal state | $5 \times 10^{13}$ |
| 200 hours | $6 \times 10^{11}$ |
| 500 hours | $7 \times 10^{11}$ |
| 700 hours | $2 \times 10^{11}$ |
| 1000 hours | $8 \times 10^{10}$ |
| Glass transition temperature (° C.) | 234 |
| Heat diffusibility (° C.) | 31 |

What is claimed is:

1. A metal-plate-inserted printed wiring board having wire bonding pads formed at two levels, for use in a ball grid array type semiconductor plastic package, the printed wiring board having a structure in which the metal plate is placed in a region located as part of the thickness direction of a printed wiring board, the metal plate has a flat region in one surface, a plurality of metal protrusions having the form of frustum of a cone each are formed in the other surface of the metal plate so as to be connected to a copper foil forming a reverse surface, the metal plate has a size nearly equivalent to the size of the printed wiring board, a semiconductor is fixed on the flat region located at a level lower than the level of a signal propagation circuit and circumferential bonding pads of two levels on one surface of the printed wiring board, the metal plate and a signal propagation circuit conductor on the front surface of the printed wiring board are insulated from each other with a thermosetting resin composition, the signal propagation circuit conductor and the semiconductor chip are connected through the bonding pads of two levels by wire bonding, and at least the signal propagation circuit conductor on the front surface of the printed wiring board and a circuit conductor formed on an opposite surface of the printed wiring board or circuit conductor pads formed on the opposite surface of the printed wiring board for connecting the package to an outside with solder balls are connected with a through hole conductor insulated from the metal plate with a resin composition, the printed wiring board being produced by providing a metal plate, one surface of the metal plate having a flat region where the semiconductor is to be mounted, the other surface of the metal plate having a plurality of metal protrusions having the form of frustum of a cone each, the metal plate having a clearance hole or a slit in a region which is neither a semiconductor-chipmounting portion nor a region of the metal protrusions having the form of frustum of a cone each, placing a glass fabric base material/thermosetting resin prepreg on one surface of the metal plate, placing a glass fabric base material/thermosetting resin prepreg on the other surface of the metal plate, placing a double-side copper-clad laminate having a bonding pad of the second level and an inner layer circuit on the prepreg on one surface such that the circuit faces inward, placing a glass fabric prepreg sheet on the prepreg on the other surface, the glass fabric prepreg sheet having a hole made so as to correspond to the region of the metal protrusions and so as to have an area a little larger than the region of the metal protrusions, placing a copper foil on the glass fabric prepreg, forming the resultant set into a laminate under heat and pressure to obtain a double-side copper-clad multi-layered board, making a through hole nearly in the center of the clearance hole or the slit so as not to be in contact with the metal plate, plating the through hole with copper, removing copper foil, glass fabric base and resin layer on a semiconductor-chip-mounting portion and a bonding pad portion of the second level on a front surface, to expose the bonding pad of the second level, exposing part of the metal plate for mounting a semiconductor chip, forming the bonding pad of the first level and a circuit on the front surface, forming solder ball pads for connecting the protrusions of the metal plate to heat-diffusing solder balls and a circuit in a copper foil to which the protrusions of the metal plate are in contact, and plating at least the semiconductor-chip-mounting portion side, a wire bonding pad portion and a solder ball portion with a noble metal.

2. A printed wiring board according to claim 1, wherein the bonding pad of the second level and the metal plate for forming the semiconductor-chip-mounting portion are exposed surfaces formed by removing the metal foil forming a surface layer, cutting off thermosetting resin composition and the glass fabric base layer by a sand blasting method until the bonding pad of the second level is reached, coating the bonding pad of the second level, and then, and cutting off resin layer and glass fabric base layer by a sand blasting method until the metal plate is reached.

3. A printed wiring board according to claim 2, wherein the metal plate is a copper alloy having a copper content of at least 95% by weight or a pure copper.

\* \* \* \* \*